United States Patent
Okumura

(10) Patent No.: US 6,377,597 B1
(45) Date of Patent: Apr. 23, 2002

(54) GALLIUM NITRIDE SEMICONDUCTOR LIGHT EMITTING ELEMENT WITH ACTIVE LAYER HAVING MULTIPLEX QUANTUM WELL STRUCTURE AND SEMICONDUCTOR LASER LIGHT SOURCE DEVICE

(75) Inventor: Toshiyuki Okumura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/380,537

(22) PCT Filed: Feb. 27, 1998

(86) PCT No.: PCT/JP98/00828

§ 371 Date: Sep. 2, 1999

§ 102(e) Date: Sep. 2, 1999

(87) PCT Pub. No.: WO98/39827

PCT Pub. Date: Sep. 11, 1998

(30) Foreign Application Priority Data

Mar. 7, 1997 (JP) ................................................ 9/52596
Mar. 19, 1997 (JP) ................................................ 9/65725

(51) Int. Cl.[7] ................................................ H01S 5/12

(52) U.S. Cl. ...................................... 372/45; 372/46

(58) Field of Search .................... 372/45, 46; 257/13, 257/77, 103, 96, 190, 76, 88, 94

(56) References Cited

U.S. PATENT DOCUMENTS

| 4,669,086 | A | * | 5/1987 | Kaede | 373/32 |
| 5,057,881 | A | * | 10/1991 | Lobentanzer | 357/17 |
| 5,923,690 | A | * | 7/1999 | Kume | 372/46 |
| 6,046,096 | A | * | 4/2000 | Ouchi | 438/510 |
| 6,154,477 | A | * | 11/2000 | Weidenheimer | 372/50 |

FOREIGN PATENT DOCUMENTS

| EP | 0 716 457 A2 | 6/1996 |
| EP | 0 746 067 A1 | 12/1996 |
| GB | 2 301 708 A | 12/1996 |
| JP | 2-168746 | 6/1990 |
| JP | 08-264902 A | 10/1996 |
| JP | 08-316528 A | 11/1996 |
| JP | 08-330680 | 12/1996 |
| JP | 09-036430 A | 2/1997 |
| JP | 09-116225 A | 5/1997 |
| JP | 09-191160 A | 7/1997 |
| JP | 63-257286 A | 10/1998 |

OTHER PUBLICATIONS

"Ridge–geometry InGaN multi–quantum–well–structure laser diodes," by Shuji Nakamura et al., Appl. Phys. Lett. 69 (10), Sep. 2, 1996, pp: 1477–9.
Patent Abstracts of Japan vol. 018, No. 673 (E–1647), Dec. 19, 1994 & JP 06 26857 A (Nichia Chem Ind. Ltd), Sep. 22, 1994).

(List continued on next page.)

Primary Examiner—James W. Davie
Assistant Examiner—Gioacchino Inzirillo
(74) Attorney, Agent, or Firm—Morrison & Foerster LLP

(57) ABSTRACT

A gallium nitride semiconductor laser device has an active layer (6) made of a nitride semiconductor containing at least indium and gallium between an n-type cladding layer (5) and a p-type cladding layer (9). The active layer (6) is composed of two quantum well layers (14) and a barrier layer (15) interposed between the quantum well layers, and constitutes an oscillating section of the semiconductor laser device. The quantum well layers (14) and the barrier layer (15) have thicknesses of, preferably, 10 nm or less. In this semiconductor laser device, electrons and holes can be uniformly distributed in the two quantum well layers (14). In addition, electrons and holes are effectively injected into the quantum well layers from which electrons and holes have already been disappeared by recombination. Consequently, the semiconductor laser device has an excellent laser oscillation characteristic.

11 Claims, 10 Drawing Sheets

OTHER PUBLICATIONS

Korte et al. "Interaction of the Dopants MG and SI In Alxga–XAS/GAAS Heterolayers (MOVPE): Application to DQW Laser Structures" Journal of Crystal Growth, vol. 107, No. 1/04, Jan. 1, 1991, pp. 779–783.

Khan et al: "UV, Blue and Green Light Emitting Diodes Based on GaN–InGan Multiple Quantum Wells Over Sapphire And (111) Spinel Substrates" Materials Science And Engineering B, Ch. Elsevier Sequoia, Lausanne, vol. 43, No. 1–3, Jan. 1, 1997 pp. 265–268.

Laidig W. D. et al.: "Properties of INXGAI–XAS–GAAS Strained–Layer Quantum–Well–Heterostructure Injection Lasers" Journal of Applied Physics, vol. 57, No. 1 Jan. 1985, pp. 33–38.

Patent Abstracts of Japan vol. 017, No. 453 (E–1417), Aug. 19, 1993 & JP 05 102604 Apr. 23, 1993.

Itaya K. et al.: "Room Temperature Pulsed Operation of Nitride Based Multi–Quantum–Well Laser Diodes With Cleavd Facets on Conventional C–Face Sapphire Substrates" Japanese Journal of Applied Physics, JP, Publication Office Japanese Journal of Applied Physics. Tokyo, vol. 35, No. 10B, Part 02, Oct. 15, 1996 pp. L1315–L1317.

Applied Physics Letters, vol. 69, No. 20, pp. 3034–3036 entitled Continuous–Wave Operation of InGaN Multi–Quantum–Well–Structure Laser Diodes at 233 K Shuji Nakamura et al.

* cited by examiner

Frequency Capable of Modulating Optical Output power (Max. Frequency=●)    Threshold Current (○)

Number of Quantum Well Layers

Frequency Capable of Modulating Optical Output power

Thickness of Barrier Layer [nm]

GALLIUM NITRIDE SEMICONDUCTOR LIGHT EMITTING ELEMENT WITH ACTIVE LAYER HAVING MULTIPLEX QUANTUM WELL STRUCTURE AND SEMICONDUCTOR LASER LIGHT SOURCE DEVICE

TECHNICAL FIELD

The present invention relates to gallium nitride semiconductor light emitting devices such as semiconductor lasers and semiconductor diodes, and also to semiconductor laser light source devices, and more particularly, to a light emitting device having a multi-quantum-well structure active layer made of nitride semiconductor.

BACKGROUND ART

As a semiconductor material for semiconductor laser devices (LDs) and light emitting diode devices (LEDs) having emission wavelengths within a wavelength range of ultraviolet to green, gallium nitride semiconductors (GaInAlN) are used. A blue LD using such a gallium nitride semiconductor is described in, for example, Applied Physics Letters, vol. 69, No. 10, p. 1477–1479, and a sectional view of the blue LD is shown in FIG. 19. FIG. 20 is an enlarged view of part E in FIG. 19.

Referring to FIG. 19, reference numeral 101 denotes a sapphire substrate, 102 denotes a GaN buffer layer, 103 denotes an n-GaN contact layer, 104 denotes an n-$In_{0.05}Ga_{0.95}N$ layer, 105 denotes an n-$Al_{0.05}Ga_{0.95}N$ cladding layer, 106 denotes an n-GaN guide layer, 107 denotes a multi-quantum-well structure active layer composed of $In_{0.2}Ga_{0.8}N$ quantum well layers and $In_{0.05}Ga_{0.95}N$ barrier layers, 108 denotes a p-$Al_{0.2}Ga_{0.8}N$ layer, 109 denotes a p-GaN guide layer, 110 denotes a p-$Al_{0.05}Ga_{0.95}N$ cladding layer, 111 denotes a p-GaN contact layer, 112 denotes a p-side electrode, 113 denotes an n-side electrode, and 114 denotes a $SiO_2$ insulating film. In this arrangement, as shown in FIG. 20, the multi-quantum-well structure active layer 107 is composed of five 3 nm thick $In_{0.2}Ga_{0.8}N$ quantum well layers 117 and four 6 nm thick $In_{0.05}Ga_{0.95}N$ barrier layers 118, totally nine layers, where the quantum well layers and the barrier layers are alternately formed.

Also, in Applied Physics Letters, vol. 69, No. 20, p. 3034–3036, there is described a structure that the quantum well structure active layer is composed of alternately stacked three 4 nm thick quantum well layers and two 8 nm thick barrier layers, totally five layers.

Japanese Patent Laid-Open Publication HEI 8-316528 also describes a blue LD using a gallium nitride semiconductor. This prior-art blue LD also uses a multi-quantum-well structure active layer having five or more quantum well layers, as in the case shown in FIGS. 19 and 20.

Meanwhile, a blue LED using a gallium nitride semiconductor is described in, for example, the aforementioned Japanese Patent Laid-Open Publication HEI 8-316528, and a sectional view of the blue LED is shown in FIG. 21. Referring to FIG. 21, reference numeral 121 denotes a sapphire substrate, 122 denotes a GaN buffer layer, 123 denotes an n-GaN contact layer, 124 denotes an n-$Al_{0.3}Ga_{0.7}N$ second cladding layer, 125 denotes an n-$In_{0.01}Ga_{0.99}N$ first cladding layer, 126 denotes a 3 nm thick $In_{0.05}Ga_{0.95}N$ single-quantum-well structure active layer, 127 denotes a p-$In_{0.01}Ga_{0.99}N$ first cladding layer, 128 denotes a p-$Al_{0.3}Ga_{0.7}N$ second cladding layer, 129 denotes a p-GaN contact layer, 130 denotes a p-side electrode, and 131 denotes an n-side electrode. Like this, in blue LEDs using gallium nitride semiconductors, an active layer having only one quantum well layer has been used.

The conventional blue LDs and blue LED described above, however, have had the following problems.

Referring first to the blue LDs, the value of oscillation threshold current is as high as 100 mA or more and so needs to be largely reduced for practical use in information processing for optical disks or the like. Further, if the LD is used for optical disks, in order to prevent data read errors due to noise during data reading, it is necessary to inject a high-frequency current of an about 300 MHz frequency into the LD and modulate an optical output power with the same frequency. In the conventional blue LDs, however, optical output power is not modulated even if a high-frequency current is injected, causing a problem of data read errors.

Referring now to blue LEDs, which indeed have been in practical use, in order to allow blue LEDs to be used for a wider variety of applications including, for example, large color displays capable of displaying bright even at wide angles of visibility, it is desired to realize even higher brightness LEDs by improving optical output power.

Furthermore, conventional gallium nitride LEDs have a problem that as the injection current increases, the peak value of emission wavelengths largely varies. For example, in a gallium nitride blue LED, as the forward current is increased from 0.1 mA to 20 mA, the peak value of emission wavelengths shifts byas much as7 nm. This is particularly noticeable in LED devices having long emission wavelengths; for example, in a gallium nitride green LED, the peak value of emission wavelengths shifts by as much as 20 nm. When such a device is used in a color display, there would occur a problem that colors of images vary depending on the brightness of the images because of the shift of the peak wavelength.

DISCLOSURE OF THE INVENTION

In view of the above, a primary object of the present invention is to solve the above-described problems of the gallium nitride semiconductor light emitting devices and provide a gallium nitride semiconductor light emitting device which makes it possible to realize a semiconductor laser diode having satisfactory laser oscillation characteristics as well as a light emitting diode capable of yielding high optical output power.

A further object of the present invention is to provide a gallium nitride semiconductor light emitting device which makes it possible to realize a light emitting diode device free from the shift of the peak wavelength due to the injection of electric current.

A gallium nitride semiconductor light emitting device according to an embodiment of the present invention comprises a semiconductor substrate, an active layer having a quantum well structure and made of nitride semiconductor containing at least indium and gallium, and a first cladding layer and a second cladding layer for sandwiching the active layer therebetween, and the active layer is composed of two quantum well layers and one barrier layer interposed between the quantum well layers.

When this gallium nitride semiconductor light emitting device is used as a semiconductor laser device, the active layer forms an oscillating section of the semiconductor laser device. Besides, when a driving circuit for injecting an electric current into the semiconductor laser device is provided, a semiconductor laser light source device is realized. Meanwhile, when the gallium nitride semiconductor light emitting device is used as a semiconductor light emitting diode device, the active layer forms a light emitting section of the semiconductor light emitting diode device.

In making the present invention as described above, the present inventor investigated in detail the causes of the aforementioned problems of the conventional devices. As a result, the following was found out.

First, with regard to blue LDs, in the InGaN material to be used for a quantum well layer, both electrons and holes have large effective masses and numerous crystal defects are present, causing the mobility of the electrons and holes to considerably lower, so that the electrons and holes are not distributed uniformly in all the quantum well layers of the multi-quantum-well structure active layer. That is, electrons are injected into only two or so of the quantum well layers on the n-type cladding layer side for electron injection, and holes are injected into only two or so of the quantum well layers on the p-type cladding layer side for hole injection. Accordingly, in the multi-quantum-well structure active layer having five or more quantum well layers, because of a small percentage or rate at which electrons and holes are present in the same quantum well layer, the efficiency of light emission by recombination of electrons and holes lowers, causing the threshold current value of laser oscillation to increase.

Also, because of the low mobility of electrons and holes as shown above, the move of electrons and holes between quantum well layers is slowed down so that electrons and holes cannot be newly injected into the quantum well layers from which electrons and holes have already been disappeared by recombination, and that the electrons and holes that have been injected into quantum well layers close to the cladding layers remain present in the same quantum well layers as they are. Accordingly, even if the injection current is modulated, the densities of electrons and holes present in the quantum well layers are not modulated. This is why injection of a high frequency current does not modulate the optical output power.

In the light of this finding, in the embodiment of the present invention, two quantum well layers are provided in the active layer made of nitride semiconductor containing at least indium and gallium, so that electrons and holes are uniformly distributed in all the quantum well layers. This realizes the improvement of the emission efficiency and hence the reduction of the oscillation threshold current value. Further, because the injection of electrons and holes into the quantum well layers from which electrons and holes have disappeared due to their recombination is effectively achieved, the injection of a high-frequency current successfully modulates the densities of electrons and holes present in the quantum well layers and hence the optical output power.

For making electrons and holes uniformly distributed in all the quantum well layers like this, because too large a layer thickness of a quantum well layer would hinder electrons and holes from being uniformly distributed, each of the quantum well layers preferably has a thickness of 10 nm or less.

Likewise, because too large a layer thickness of the barrier layer would hinder electrons and holes from being uniformly distributed, the barrier layer preferably has a thickness of 10 nm or less.

Meanwhile, with regard to blue LEDs, practically used devices have a tendency that the optical output power comes to be saturated as the current is injected more and more, as shown in FIG. 9. In the conventional blue LEDs, which have only one quantum well active layer, injected electrons and holes are both present in this one quantum well layer, but with the increasing amount of injection, the distribution of injected electrons and holes spreads widely within the momentum space because of the large effective masses of the electrons and holes in InGaN that forms the quantum well layer, with the result that the emission efficiency is lowered. Therefore, with the provision of the two quantum well layers in the multi-quantum-well structure active layer made of a nitride semiconductor containing at least indium and gallium, as in the present invention, injected electrons and holes are divided into the two quantum well layers, by which the densities of electrons and holes present per quantum well layer are reduced. Thus, the distribution of electrons and holes in the momentum space is reduced. As a result of this, the tendency of saturation in the current vs. optical output power characteristic has been mended, and a gallium nitride LED device with high brightness attributable to improved optical output power has been realized.

Further, another investigation and experiment that the present inventor performed proved that with a 4 nm or lower thickness of the barrier layer, even if the quantum well layers are increased in number up to four, results similar to those described above could be obtained in both LDs and LEDs. The quantum well structure active layer of the conventional device described in the foregoing literature, "Applied Physics Letters, vol. 69, No. 20, p. 3034–3036", has three quantum well layers, but because of the large effective masses of electrons and holes of the InGaN material as well as a large thickness of the barrier layer of as much as 8 nm, the wave functions of electrons and holes hardly overlap between the quantum well layers. Therefore, there occur almost no moves of electrons or holes between the quantum well layers, which has caused nonuniform distribution of electrons and holes more noticeably. However, it has been discovered that even if three or four quantum well layers are provided, the wave functions of electrons and holes can be overlapped between the quantum well layers by setting the thickness of barrier layers to 4 nm or less.

It has also been found out that setting the thickness of the barrier layer to 4 nm or less simultaneously solves the problem of peak wavelength shift due to current injection. The cause of such wavelength shift could be considered as follows. That is, in the InGaN material, the electron-hole plasma effect is noticeable because of the large effective masses of electrons and holes, so that energy band ends is largely deformed due to this effect, resulting in an increased shift of the peak emission wavelength due to the current injection. Therefore, it can be concluded that as a result of suppressing the electron-hole plasma effect by reducing the densities of electrons and holes per quantum well layer in such a way that the injected electrons and holes are divided uniformly into the individual quantum well layers as in the present invention, the wavelength shifts due to the current injection have also been reduced.

Further objects, features and advantages of the present invention will be understood from the detailed description of several embodiments thereof which will be given below with reference to the accompanying drawings.

BEST MODE FOR CARRYING OUT THE INVENTION

Hereinbelow, embodiments of the present invention are described with reference to the accompanying drawings.

First Embodiment

Figure 1:
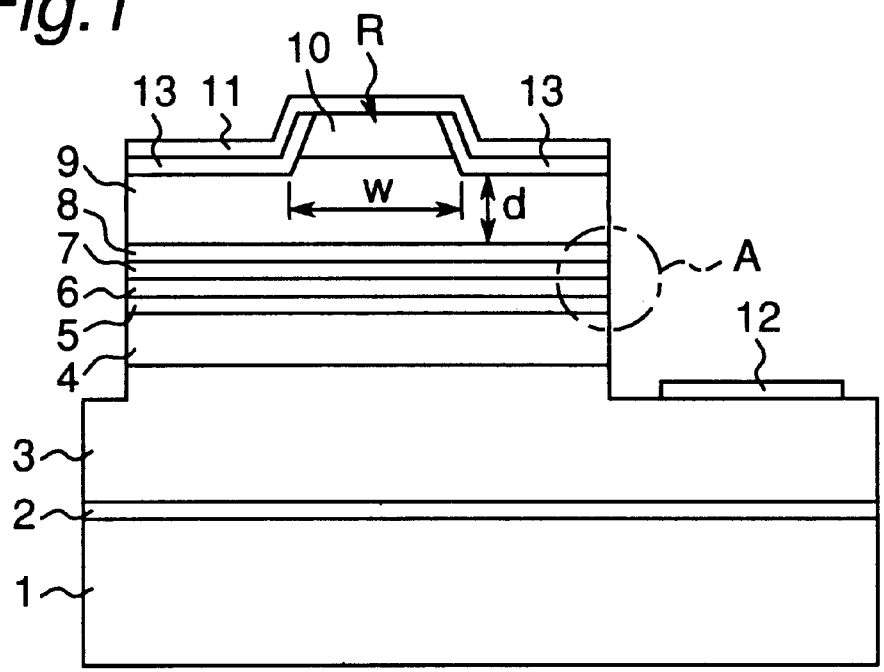
FIG. 1 is a sectional view showing a semiconductor laser device according to a first embodiment of the present invention.
Figure 2:
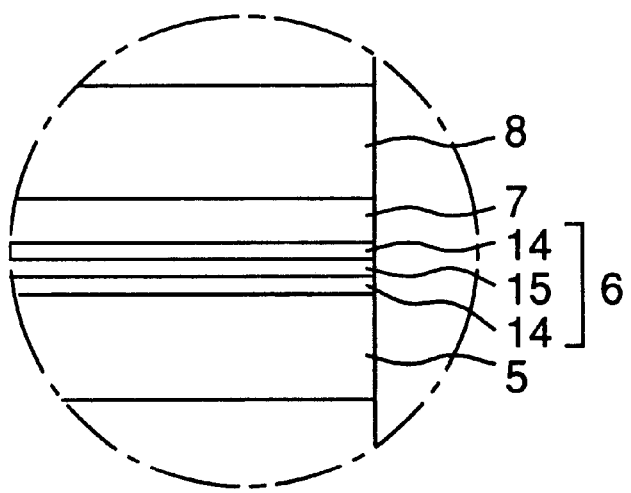
FIG. 2 is an enlarged sectional view of part A in FIG. 1.

FIG. 1 is a sectional view showing a gallium nitride semiconductor laser device according to a first embodiment of the present invention, and FIG. 2 is an enlarged sectional view of part A of FIG. 1. In this embodiment, a quantum well structure active layer consists of two quantum well layers and one barrier layer disposed therebetween.

Figure 7:
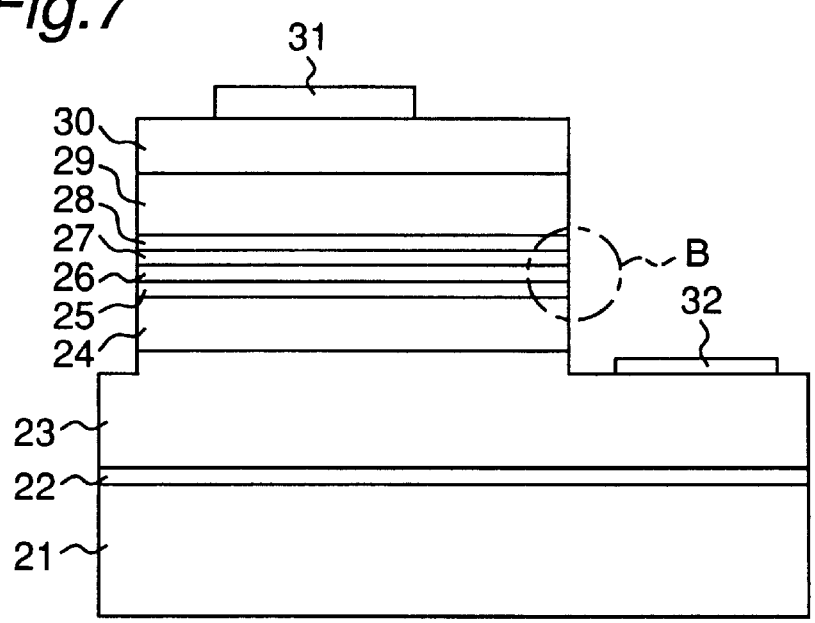
FIG. 7 is a sectional view showing a semiconductor light emitting diode device according to a fourth embodiment of the present invention.
Figure 10:
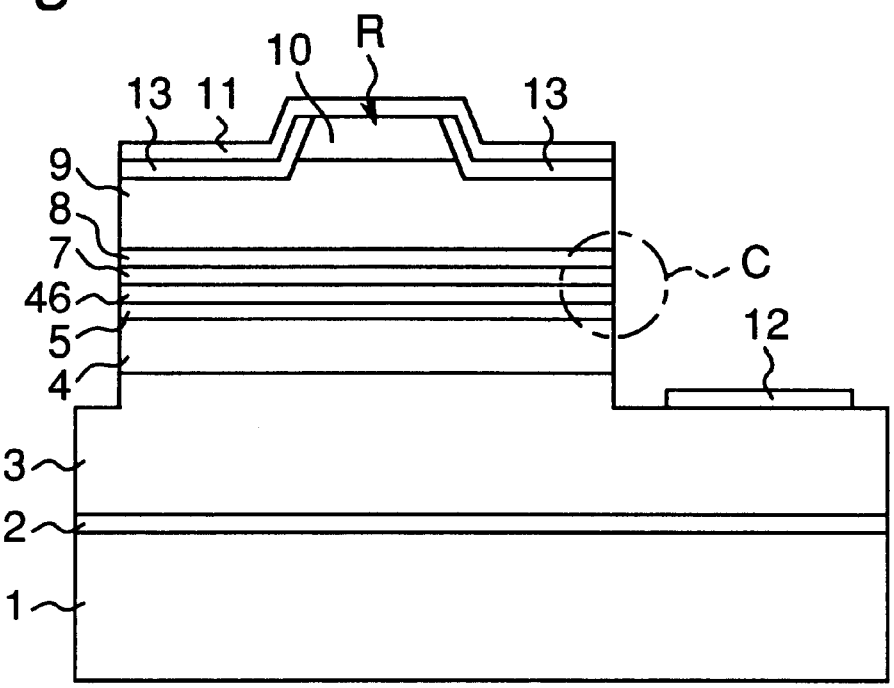
FIG. 10 is a sectional view showing a semiconductor laser device according to a fifth embodiment of the present invention.
Figure 16:
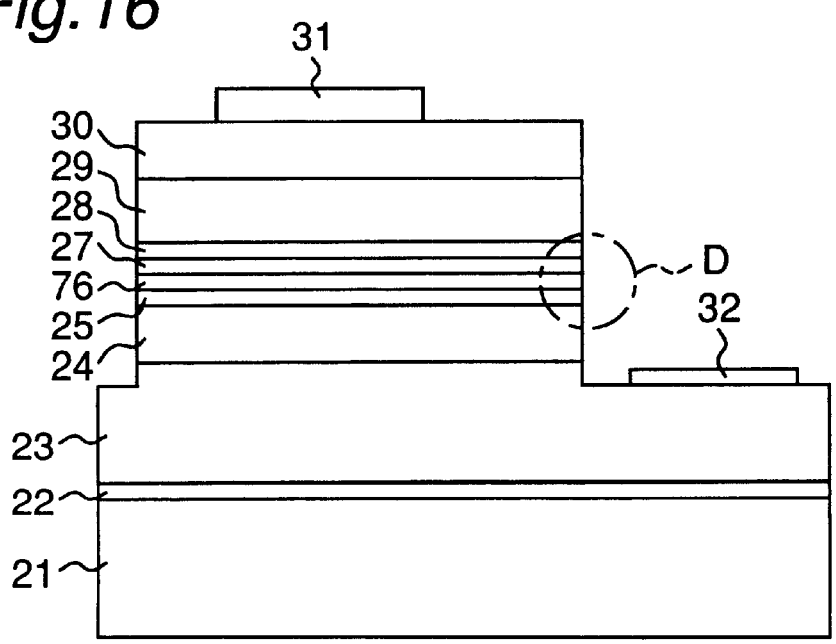
FIG. 16 is a sectional view showing a semiconductor light emitting diode device according to an eighth embodiment of the present invention.

Referring to FIGS. 1 and 2, reference numeral 1 denotes a c-face sapphire substrate, 2 denotes a GaN buffer layer, 3 denotes an n-GaN contact layer, 4 denotes an n-$Al_{0.1}Ga_{0.9}N$ cladding layer, 5 denotes an n-GaN guide layer, 6 denotes a multi-quantum-well structure active layer consisting of two $In_{0.2}Ga_{0.8}N$ quantum well layers 14 and one $In_{0.05}Ga_{0.95}N$ barrier layer 15, 7 denotes an $Al_{0.2}Ga_{0.8}N$ evaporation inhibiting layer, 8 denotes a p-GaN guide layer, 9 denotes a p-$Al_{0.1}Ga_{0.9}N$ cladding layer, 10 denotes a p-GaN contact layer, 11 denotes a p-side electrode, 12 denotes an n-side electrode, and 13 denotes a $SiO_2$ insulating film. In FIG. 1 the multi-quantum-well structure active layer 6 formed of a plurality of layers is depicted as if it consisted of a single layer, for the sake of simplification. That is the case also with FIGS. 7, 10 and 16 showing sectional views of other embodiments.

The top surface of the sapphire substrate 1 in this embodiment may alternatively be of another orientation such as a-face, r-face and m-face. Also, not only the sapphire substrate but also a SiC substrate, a spinel substrate, a MgO substrate, a Si substrate or a GaAs substrate may be used. In particular, the SiC substrate, which is more easily cleaved as compared with the sapphire substrate, has an advantage that a laser resonator end face is easy to form by cleaving. The buffer layer 2 is not limited to GaN, and may be substituted by other material such as AlN or a ternary mixed crystal AlGaN so long as the material allows a gallium nitride semiconductor to be epitaxially grown thereon.

The n-type cladding layer 4 and the p-type cladding layer 9 may also be of an AlGaN ternary mixed crystal having an Al content different from that of n-$Al_{0.1}Ga_{0.9}N$. In this case, increasing the Al content increases energy gap difference and refractive index difference between the active layer and the cladding layers, so that carriers and light can be effectively confined in the active layer, which makes it possible to further reduce the oscillation threshold current and to improve temperature characteristics. Also, decreasing the Al content while maintaining the confinement of carriers and light causes the mobility of the carriers in the cladding layers to increase, thus producing an advantage that the device resistance of the semiconductor laser device is decreased. Further, alternatively these cladding layers may be made from a quaternary or higher mixed crystal semiconductor containing other elements in trace amounts, and the n-type cladding layer 4 and the p-type cladding layer 9 may be different in composition of the mixed crystal from each other.

The guide layers 5 and 8 are not limited to GaN, and may be made from other material such as InGaN, AlGaN or other ternary mixed crystal, or InGaAlN or other quaternary mixed crystal so long as the material has an energy gap value falling between the energy gap of the quantum well layers of the multi-quantum-well structure active layer 6 and the energy gap of the cladding layers 4, 9. Also, each guide layer does not need to be doped all over with a donor or an acceptor, but may be partly left non-doped on one side closer to the multi-quantum-well structure active layer 6, and furthermore the whole guide layer may be left non-doped. In this case, the carriers present in the guide layers are reduced in amount so that light absorption by free carriers is reduced. Thus, advantageously the oscillation threshold current can be further reduced.

For the two $In_{0.2}Ga_{0.8}N$ quantum well layers 14 and the one $In_{0.05}Ga_{0.95}N$ barrier layer 15 constituting the multi-quantum-well structure active layer 6, their compositions may be set according to a necessary laser oscillation wavelength. The In content of the quantum well layers 14 should be increased for longer oscillation wavelengths, and the In content of the quantum well layers 14 should be decreased for shorter oscillation wavelengths. Further, the quantum well layers 14 and the barrier layer 15 may also be made from quaternary or higher mixed crystal semiconductor composed of InGaN ternary mixed crystal and, in addition to this, other elements such as Al in trace amounts. The barrier layer 15 may also be made of GaN simply.

Next, with reference to FIGS. 1 and 2, the method for fabricating the above gallium nitride semiconductor laser is described. Although the MOCVD (Metal Organic Chemical Vapor Deposition) method is used in the following description, yet the growth method has only to be capable of making GaN epitaxially grown, and other vapor phase growth method such as MBE (Molecular Beam Epitaxy) or HDVPE (Hydride Vapor Phase Epitaxy) may be also used.

First, on a sapphire substrate 1 having the c plane as a top surface and placed within a growth furnace, a GaN buffer layer 2 is grown to 35 nm at a growth temperature of 550° C. by using trimethyl gallium (TMG) and ammonia ($NH_3$) as sources.

Next, with the growth temperature elevated to 1050° C., a 3 μm thick Si-doped n-GaN contact layer 3 is grown by using TMG and $NH_3$ as well as silane gas ($SiH_4$) as source materials. Subsequently, with trimethyl aluminum (TMA) added to the source materials and with the growth temperature held at 1050° C., a Si-doped n-$Al_{0.1}Ga_{0.9}N$ cladding layer 4 is grown to a thickness of 0.7 μm. Subsequently, with TMA withdrawn from the source materials and with the growth temperature held at 1050° C., a Si-doped n-GaN guide layer 5 is grown to 0.05 μm.

Next, with the growth temperature lowered to 750° C., by using TMG, $NH_3$ and trimethyl indium (TMI) as source materials, an $In_{0.2}Ga_{0.8}N$ quantum well layer (with a thickness of 5 nm) 14, an $In_{0.05}Ga_{0.95}N$ barrier layer (with a thickness of 5 nm) 15, an $In_{0.2}Ga_{0.8}N$ quantum well layer (with a thickness of 5 nm) 14 are grown one after another to form a multi-quantum-well structure active layer (with a total thickness of 15 nm) 6. Subsequently, with TMG, TMA and $NH_3$ used as source materials and with the growth temperature held at 750° C., a $Al_{0.2}Ga_{0.8}N$ evaporation inhibiting layer 7 is grown to a thickness of 10 nm.

Next, with the growth temperature elevated again to 1050° C. and with TMG and $NH_3$ as well as cyclopentadienyl magnesium ($Cp_2Mg$) used as source materials, a Mg-doped p-GaN guide layer 8 is grown to a thickness of 0.05 μm. Subsequently, with TMA added to the source materials and with the growth temperature held at 1050° C., a 0.7 μm thick Mg-doped p-$Al_{0.1}Ga_{0.9}N$ cladding layer 9 is grown. Then, with TMA withdrawn from the source material and with the growth temperature held at 1050° C., a Mg-doped p-GaN contact layer 10 is grown to 0.2 μm in thickness. Thus, a gallium nitride epitaxial wafer is completed.

After these process steps, this wafer is annealed in a nitrogen gas atmosphere of 800° C., so that the Mg-doped p-type layers are lowered in resistance.

Further, by using ordinary photolithography and dry etching techniques, an etching is done from the topmost surface of the p-GaN contact layer 10 until the n-GaN contact layer 3 is exposed, to obtain a 200 μm wide stripe shape. Next, by using photolithography and dry etching techniques similar to the foregoing, the p-GaN contact layer 10 and the p-$Al_{0.1}Ga_{0.9}N$ cladding layer 9 are etched so that the remaining p-GaN contact layer 10 has a ridge structure in a 5 μm wide stripe shape.

Subsequently, a 200 nm thick $SiO_2$ insulating film 13 is formed on the side faces of the ridge R and the surface of the p-type layer other than the ridge R. A p-side electrode 11 composed of nickel and gold is formed on the surface of this $SiO_2$ insulating film 13 and the p-GaN contact layer 10, and an n-side electrode 12 composed of titanium and aluminum is formed on the surface of the n-GaN contact layer 3 exposed by the etching. Thus, a gallium nitride LD (laser diode) wafer is completed.

After these process steps, the thus obtained wafer is cleaved in a direction vertical to the ridge stripe to thereby form a laser resonator end face, and then the wafer is divided into individual chips. Then, each chip is mounted on a stem, and the electrodes are connected with lead terminals by wire bonding. As a result, a gallium nitride semiconductor LD device is completed.

On the blue LD device fabricated in this way, it was confirmed that laser characteristics of an oscillation wavelength of 430 nm and an oscillation threshold current of 40 mA can be obtained, and that an optical output power can be enough modulated by injection of a high-frequency current of from 300 MHz to maximally around 1 GHz. Consequently, with the blue LD device of this embodiment, a blue LD device capable of preventing data read errors and usable for optical disks was realized.

Figure 3:
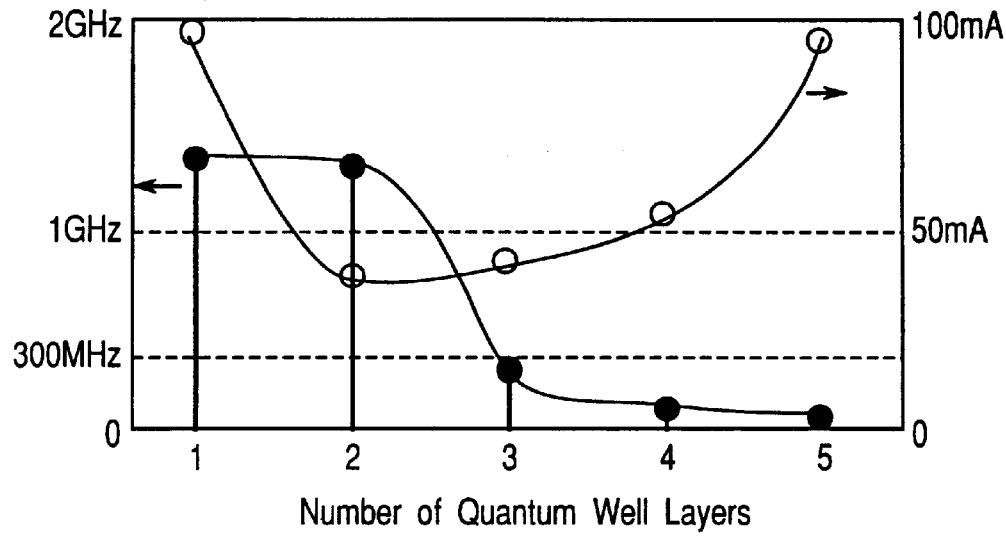
FIG. 3 is a graph showing the dependence of threshold current on the number of quantum well layers as well as the dependence of a maximum modulation frequency of injection current capable of modulating the optical output power on the number of quantum well layers in the first embodiment.

FIG. 3 is a graph representing variations in threshold current value and maximum modulation frequency of injection current capable of modulating an optical output power resulting when the number of quantum well layers is changed from 1 to 5 in gallium nitride semiconductor laser devices. The semiconductor lasers are same in structure as the gallium nitride semiconductor laser device according to the first embodiment of the present invention, except for the number of quantum well layers and the number of barrier layers, which depends on the number of quantum well layers. As can be understood from this figure, it is only the gallium nitride semiconductor laser device according to the first embodiment of the present invention, in which the number of quantum well layers is two, that has a low oscillation threshold current and has an optical output power enough modulated by the injection of a high-frequency current in the range of from 300 MHz to around 1 GHz at the most.

The quantum well layers 14 and the barrier layer 15, which constitute the multi-quantum-well structure active layer 6, have both been set to a layer thickness of 5 nm in this embodiment. However, these layers are not necessarily of the same layer thickness, but may be different from each other. Also, as far as the layer thickness of each of the quantum well layers 14 and the barrier layer 15 is set to 10 nm or less for uniform injection of electrons and holes into the two quantum well layers, similar effects can be obtained even with other layer thicknesses than the layer thickness used in this embodiment.

Figure 4:
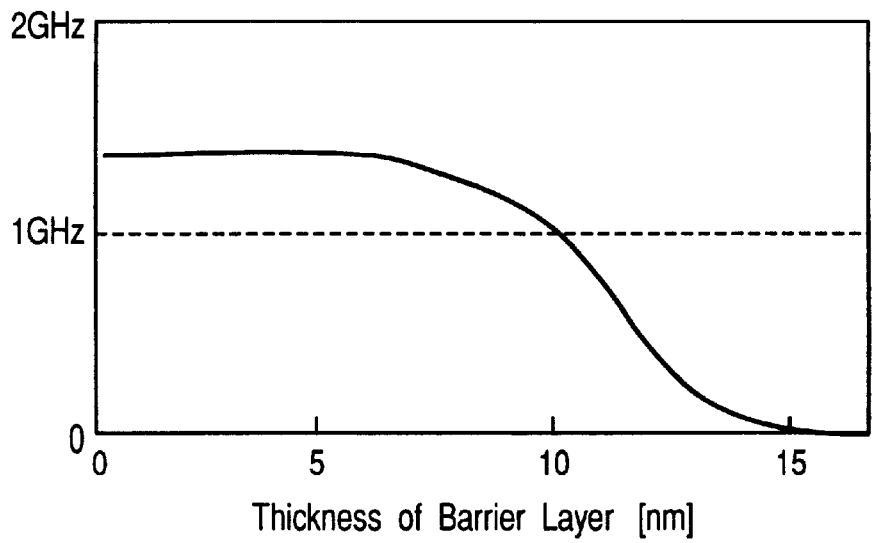
FIG. 4 is a graph showing the dependence of a maximum frequency of injection current capable of modulating the optical output power on the thickness of the barrier layer in the first embodiment.

FIG. 4 is a graph representing variations in injection current maximum modulation frequency capable of modulating an optical output power resulting when the layer thickness of the barrier layer is changed in a gallium nitride semiconductor laser device in which the number of quantum well layers is two. This semiconductor laser is similar in structure to the gallium nitride semiconductor laser device according to the first embodiment, except that they differ in the layer thickness of the barrier layer. It can be understood from this figure that if the layer thickness of the barrier layer is set to 10 nm or less, then the optical output power can be enough modulated by the injection of a high-frequency current even in the range of from 300 MHz to around 1 GHz at the most. This being the case also with the quantum well layers, it was verified that if the layer thickness of each quantum well layer is set to 10 nm or less, then the optical output power can be sufficiently modulated by the injection of a high-frequency current in the range of from 300 MHz to around 1 GHz at the most.

Further, the $Al_{0.2}Ga_{0.8}N$ evaporation inhibiting layer 7 has been formed so as to be in contact with the multi-quantum-well structure active layer 6 in this embodiment, which arrangement is intended to inhibit the quantum well layers 14 from evaporating while the growth temperature is increasing. Therefore, the evaporation inhibiting layer 7 may be made of other materials so long as the materials protect the quantum well layers 14, and AlGaN ternary mixed crystals having other Al compositions as well as GaN may be used for the evaporation inhibiting layer 7. Also, this evaporation inhibiting layer 7 may be doped with Mg, in which case holes can be more easily injected from the p-GaN guide layer 8 or the p-$Al_{0.1}Ga_{0.9}N$ cladding layer 9, advantageously. Further, if the quantum well layers 14 have a low In content, these layers 14 do not evaporate even without the evaporation inhibiting layer 7, and so omission of the evaporation inhibiting layer 7 will not affect the characteristics of the gallium nitride semiconductor laser device of this embodiment.

Whereas a ridge stripe structure is formed to achieve the contraction or narrowing of injection current in this embodiment, it is also possible to use other current contracting techniques such as an electrode stripe structure. Also, whereas a laser resonator end face is formed by cleaving in this embodiment, the end face can also be formed by dry etching in cases that the sapphire substrate is too hard to cleave.

Further, in this embodiment, in which sapphire that is an insulating material is used as a substrate, an n-side electrode 12 is formed on the top surface of the n-GaN contact layer 3 exposed by etching. However, if SiC, Si, GaAs or the like having n-type electrical conductivity is used as a substrate, then the n-side electrode 12 may be formed on the rear surface of this substrate. Besides, the p-type structure and the n-type structure may be reversed.

Second Embodiment

Figure 5:
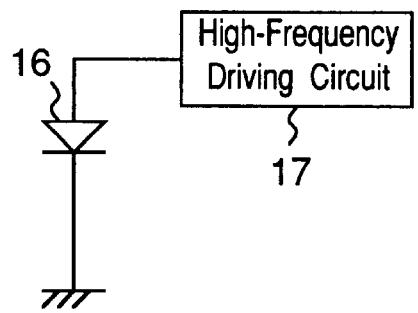
FIG. 5 is a circuit diagram showing a semiconductor laser device and a driving circuit according to a second embodiment of the present invention.

FIG. 5 is a circuit diagram showing a semiconductor laser device with a driving circuit according to a second embodiment of the present invention. A semiconductor laser device 16 shown in FIG. 5 is a gallium nitride semiconductor laser device, which has two quantum well layers, obtained by the first embodiment of the present invention. A high-frequency driving circuit 17 is made up of ordinary semiconductor parts, and is intended to modulate an injection current to the semiconductor laser device 16 at a high frequency and to thereby modulate its optical output power. In this embodiment, the modulation frequency of the injection current was set to 300 MHz. The gallium nitride semiconductor laser device according to the first embodiment has revealed that its optical output power is modulatable even by a maximum injection current modulation frequency of higher than 1 GHz, and the optical output power was enough modulated by a frequency of 300 MHz. When the present embodiment was used as a light source for an optical disk, by virtue of sufficiently modulated optical output power of the semiconductor laser, the laser light coherence was able to be lowered so that noise due to return light from the disk surface was able to be reduced. As a result, it became possible to read data from the optical disk without errors.

The modulation frequency of the injection current was set to 300 MHz in this embodiment. However, other modulation frequencies up to a maximum frequency of around 1 GHz may be used to drive the nitride semiconductor laser so long as the modulation frequency allows the noise due to return light of laser light from the disk surface to be reduced by lowering the coherence of the laser light.

Third Embodiment

Figure 6:
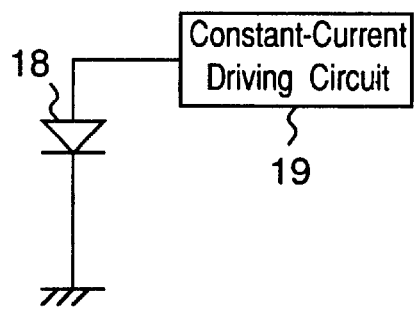
FIG. 6 is a circuit diagram showing a semiconductor laser device and a driving circuit according to a third embodiment of the present invention.

FIG. 6 is a circuit diagram showing a semiconductor laser device with a driving circuit according to a third embodiment of the present invention. For a semiconductor laser device 18 shown in FIG. 6, the gallium nitride semiconductor laser device with two quantum well layers obtained by the first embodiment of the present invention is used, but is adjusted in the stripe width w (see FIG. 1) in the formation of the ridge structure as well as in the depth for the etching of the p-$Al_{0.1}Ga_{0.9}N$ cladding layer 9 so that the semiconductor laser device 18 is a self-oscillating semiconductor laser in which the optical output power is modulated even by the injection of an unmodulated constant current. In this example, the stripe width w was set to 3 $\mu$m, the film thickness d (see FIG. 1) of the p-$Al_{0.1}Ga_{0.9}N$ cladding layer 9 left in the etching process was set to 0.2 $\mu$m. The stripe width and the film thickness left in etching are not limited to the values of this concrete example, and have only to fall within a range of 1 to 5 $\mu$m and a range of 0.05 to 0.5 $\mu$m, respectively. The optical output power modulation frequency for the self-oscillating gallium nitride semiconductor laser device fabricated in this way was 800 MHz.

By virtue of the arrangement that two quantum well layers are provided, the gallium nitride semiconductor laser device according to the third embodiment is susceptible to modulation of the densities of electrons and holes present within the quantum well layers. Thus, it is easy to fabricate a self-oscillating semiconductor laser in which an optical output power is modulated not only by modulating the densities of electrons and holes with modulation of the injection current but also by modulating the densities of electrons and holes even with the injection of an unmodulated constant current, thus making it possible to modulate -the optical output power at higher frequencies.

A constant current driving circuit 19 is implemented by using ordinary semiconductor parts and is intended to inject a constant current to the semiconductor laser. When this embodiment was used as a light source for an optical disk, by virtue of sufficiently modulated optical output power of the semiconductor laser, the laser light coherence was able to be lowered so that noise due to return light from the disk surface was able to be reduced. As a result, it became possible to read data from the optical disk without errors.

The gallium nitride semiconductor laser device 18 used in the third embodiment is a self-oscillating semiconductor laser obtained by adjusting both the stripe width w in forming the ridge structure and the depth to which the p-$Al_{0.1}Ga_{0.9}N$ cladding layer 9 is etched. Alternatively, the self-oscillating semiconductor laser may be obtained by providing a saturable absorption layer (not shown) near the active layer, as done in ordinary GaAs semiconductor lasers or the like.

Fourth Embodiment

Figure 8:
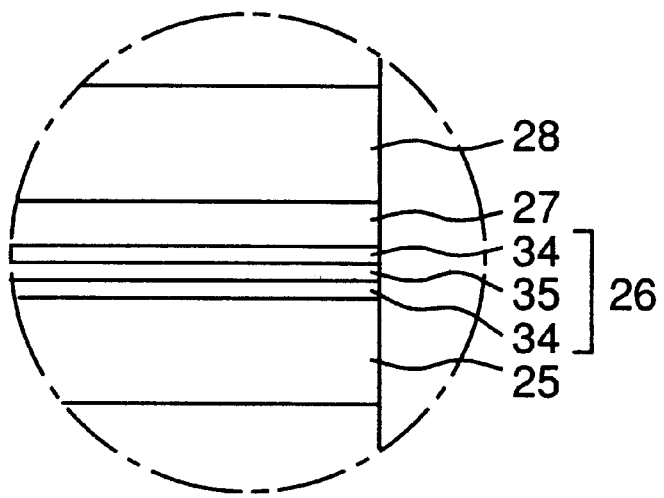
FIG. 8 is an enlarged sectional view of part B in FIG. 7.

FIG. 7 is a sectional view showing a gallium nitride semiconductor LED device according to a fourth embodiment of the present invention, and FIG. 8 is an enlarged sectional view of part B of FIG. 7.

In these figures, reference numeral 21 denotes a c-face sapphire substrate, 22 denotes a GaN buffer layer, 23 denotes an n-GaN contact layer, 24 denotes an n-$Al_{0.1}Ga_{0.9}N$ cladding layer, 25 denotes an n-GaN guide layer, 26 denotes a multi-quantum-well structure active layer consisting of two $In_{0.2}Ga_{0.8}N$ quantum well layers 34 and one $In_{0.05}Ga_{0.95}N$ barrier layer 35, 27 denotes an $Al_{0.2}Ga_{0.8}N$ evaporation inhibiting layer, 28 denotes a p-GaN guide layer, 29 denotes a p-$Al_{0.1}Ga_{0.9}N$ cladding layer, 30 denotes a p-GaN contact layer, 31 denotes a p-side electrode, and 32 denotes an n-side electrode.

The top surface of the sapphire substrate 21 in this embodiment may alternatively be of another orientation such as a-face, r-face and m-face. Also, the sapphire substrate but also a SiC substrate, a spinel substrate, a MgO substrate, or a Si substrate may be used. In particular, the SiC substrate, which is more easily cleaved as compared with the sapphire substrate, has an advantage that division into chips of the LED device is easy. The buffer layer 22 is not limited to GaN, and may be substituted by other material such as AlN or a ternary mixed crystal AlGaN so long as the material allows a gallium nitride semiconductor to be epitaxially grown thereon.

The n-type cladding layer 24 and the p-type cladding layer 29 may also be of any AlGaN ternary mixed crystal having an Al content different from that of n-$Al_{0.1}Ga_{0.9}N$, or simply of GaN. Increasing the Al content increases energy gap difference between the active layer and the cladding layers, so that carriers can be effectively confined in the active layer, which makes it possible to improve temperature characteristics. On the other hand, decreasing the Al content while maintaining the confinement of carriers causes the mobility of the carriers in the cladding layers to increase, thus producing an advantage that the device resistance of the light emitting diode is decreased. Further, alternatively these cladding layers may be made from a quaternary or higher mixed crystal semiconductor containing other elements in trace amounts, and the n-type cladding layer 24 and the p-type cladding layer 29 may be different in composition of the mixed crystal from each other.

The guide layers 25 and 28 are not limited to GaN, and may be made from other material such as InGaN, AlGaN or other ternary mixed crystal, or InGaAlN or other quaternary mixed crystal so long as the material has an energy gap value falling between the energy gap of the quantum well layers of the multi-quantum-well structure active layer 26 and the energy gap of the cladding layers 24, 29. Also, each guide layer does not need to be doped all over with a donor or an acceptor, but may be partly left non-doped on one side closer to the multi-quantum-well structure active layer 26, and furthermore the whole guide layer may be left non-doped. In this case, the carriers present in the guide layers are reduced in amount so that light absorption by free carriers is reduced. Thus, advantageously the oscillation threshold current can be further reduced, resulting in better output power. The guide layers 25 and 28 advantageously facilitate injection of electrons and holes into the multi-quantum-well structure active layer 26 from the n- and p-cladding layers 24 and 29, respectively. Those guide layers 25 and 28, however, can be dispensed with because the LED characteristics are not seriously affected or deteriorated by the dispensation of the guide layers 25 and 28.

For the two $In_{0.2}Ga_{0.8}N$ quantum well layers 34 and the one $In_{0.05}Ga_{0.95}N$ barrier layer 35 constituting the multi-quantum-well structure active layer 26, their compositions may be set according to a necessary light emission wavelength. The In content of the quantum well layers 34 should be increased for longer emission wavelengths, and the In content of the quantum well layers 34 should be decreased for shorter emission wavelengths. Further, the quantum well layers 34 and the barrier layer 35 may also be made from quaternary or higher mixed crystal semiconductor composed of InGaN ternary mixed crystal and, in addition to this, other elements such as Al in trace amounts.

Next, with reference to FIGS. 7 and 8, the method for fabricating the above gallium nitride semiconductor LED is described. Although the MOCVD (Metal Organic Chemical Vapor Deposition) method is used in the following description, yet the growth method has only to be capable of making GaN epitaxially grown, and other vapor phase growth method such as MBE (Molecular Beam Epitaxy) or HDVPE (Hydride Vapor Phase Epitaxy) may be also used.

First, on a sapphire substrate 21 having the c plane as a top surface and placed within a growth furnace, a GaN buffer layer 22 is grown to 35 nm at a growth temperature of 550° C. by using TMG and $NH_3$ as source materials.

Next, with the growth temperature elevated to 1050° C., a 3 μm thick Si-doped n-GaN contact layer 23 is grown by using TMG and $NH_3$ as well as $SiH_4$ as source materials. Subsequently, with TMA added to the source materials and with the growth temperature held at 1050° C., a Si-doped n-$Al_{0.1}Ga_{0.9}N$ cladding layer 24 is grown to a thickness of 0.3 μm. Subsequently, with TMA withdrawn from the source materials and with the growth temperature held at 1050° C., a Si-doped n-GaN guide layer 25 is grown to 0.05 μm.

Next, with the growth temperature lowered to 750° C., by using TMG, $NH_3$ and TMI as source materials, an $In_{0.2}Ga_{0.8}N$ quantum well layer (with a thickness of 3 nm) 34, an $In_{0.05}Ga_{0.95}N$ barrier layer (with a thickness of 5 nm) 35, an $In_{0.2}Ga_{0.8}N$ quantum well layer (with a thickness of 3 nm) 34 are sequentially grown one after another to form a multi-quantum-well structure active layer (with a total thickness of 11 nm) 26. Subsequently, with TMG, TMA and $NH_3$ used as source materials and with the growth temperature held at 750° C., an $Al_{0.2}Ga_{0.8}N$ evaporation inhibiting layer 27 is grown to a thickness of 10 nm.

Next, with the growth temperature elevated again to 1050° C. and with TMG and $NH_3$ as well as cyclopentadienyl magnesium used as source materials, a Mg-doped p-GaN guide layer 28 is grown to a thickness of 0.05 μm. Subsequently, with TMA added to the source materials and with the growth temperature held at 1050° C., a 0.3 μm thick Mg-doped p-$Al_{0.1}Ga_{0.9}N$ cladding layer 29 is grown. Then, with TMA withdrawn from the source material and with the growth temperature held at 1050° C., a Mg-doped p-GaN contact layer 30 is grown to 0.2 μm in thickness. Thus, a gallium nitride epitaxial wafer is completed.

After these process steps, this wafer is annealed in a nitrogen gas atmosphere of 800° C., so that the Mg-doped p-type layers are lowered in resistance.

Further, by using ordinary photolithography and dry etching techniques, an etching is done at predetermined regions from the topmost surface of the p-GaN contact layer 30 until the n-GaN contact layer 23 is exposed, for the fabrication of the LED.

Subsequently, a p-side electrode 31 composed of nickel and gold is formed on the surface of the p-GaN contact layer 30, and an n-side electrode 32 composed of titanium and aluminum is formed on the surface of the n-GaN contact layer 23 exposed by the etching. Thus, a gallium nitride LED wafer is completed.

After these process steps, the thus obtained wafer is divided into individual chips. Then, each chip is mounted on a stem, and the electrodes are connected with lead terminals by wire bonding. As a result, a gallium nitride semiconductor LED device is completed.

Figure 9:
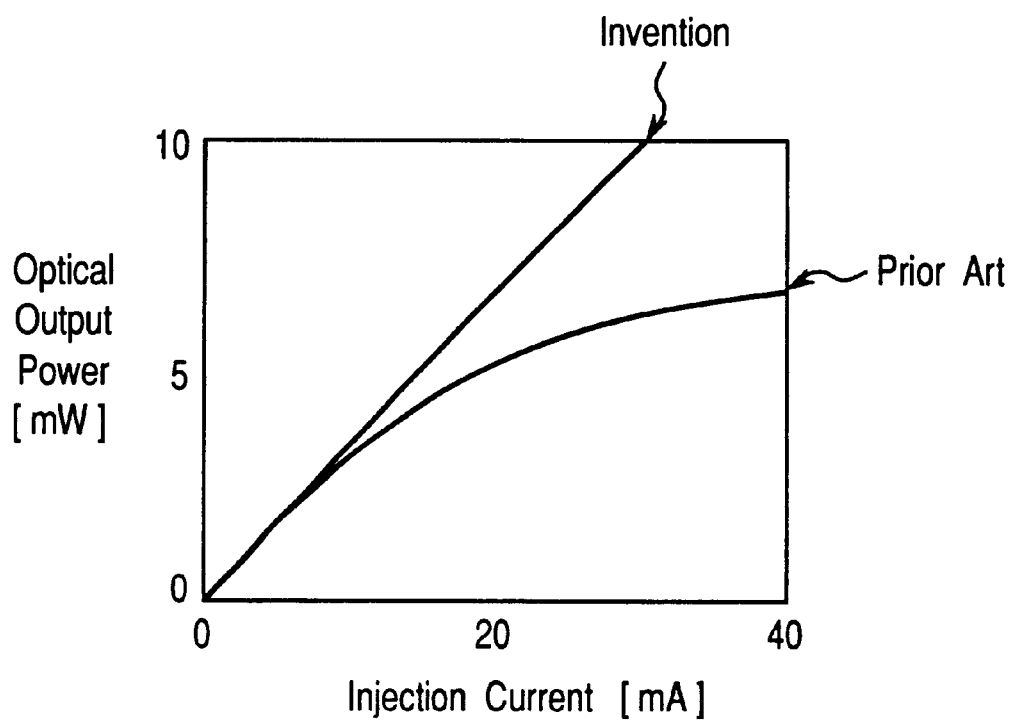
FIG. 9 is a graph showing current—optical output power characteristics of the semiconductor light emitting diode device according to the fourth embodiment and of the semiconductor light emitting diode device according to the prior art, respectively.

The blue LED device fabricated in this way had light emitting characteristics of a peak emission wavelength of 430 nm and an output power of 6 mW for a forward current of 20 mA. Also, as obvious from FIG. 9, the output power was not saturated even at a large injection current, which proves that the current-optical output power characteristic was improved, as compared with the conventional LED device.

The quantum well layers 34 and the barrier layer 35, which constitute the multi-quantum-well structure active layer 26, have a layer thickness of 3 nm and a layer thickness of 5 nm, respectively, in this embodiment. However, as far as the layer thickness of each of the quantum well layers 34 and the barrier layer 35 is set to 10 nm or less for uniform injection of electrons and holes into the two quantum well layers, similar effects can be obtained even with other layer thicknesses.

Further, the $Al_{0.2}Ga_{0.8}N$ evaporation inhibiting layer 27 is formed so as to be in contact with the multi-quantum-well structure active layer 26 in this embodiment, which arrangement is intended to inhibit the quantum well layers 34 from evaporating while the growth temperature is increasing. Therefore, the evaporation inhibiting layer 27 may be made of other materials so long as the materials protect the quantum well layers 34, and an AlGaN ternary mixed crystal having other Al content or simply GaN may be used for the evaporation inhibiting layer 27. Also, this evaporation inhibiting layer 27 may be doped with Mg, in which case, advantageously, holes can be more easily injected from the p-GaN guide layer 28 or the $p-Al_{0.1}Ga_{0.9}N$ cladding layer 29. Further, if the quantum well layers 34 have a low In content, these layers 34 do not evaporate even without the evaporation inhibiting layer 27, and so omission of the evaporation inhibiting layer 27 would not affect the characteristics of the gallium nitride semiconductor LED device of this embodiment.

Fifth Embodiment

Figure 11:
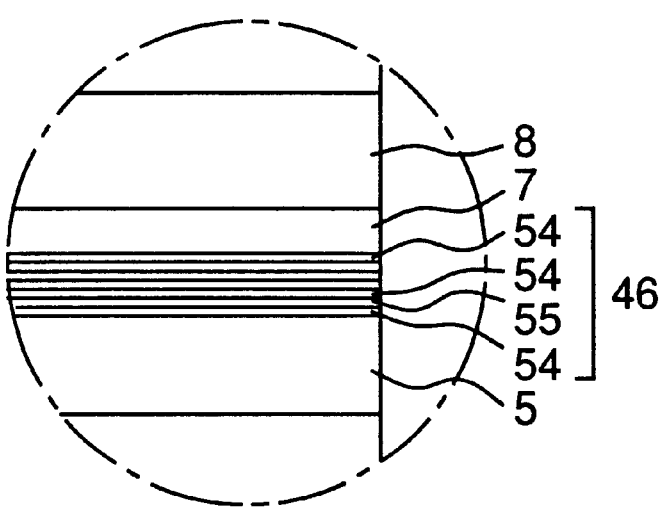
FIG. 11 is an enlarged sectional view showing part C of FIG. 10.

FIG. 10 is a sectional view showing a gallium nitride semiconductor laser device according to a fifth embodiment of the present invention, and FIG. 11 is an enlarged sectional view of part C of FIG. 10. This gallium nitride semiconductor laser device is same as the gallium nitride semiconductor laser device according to the first embodiment, except for the structure of a multi-quantum-well structure active layer 46. Therefore, for this gallium nitride semiconductor laser device, the same reference numerals as used in FIGS. 10 and 11 are used and detailed description of the layers is omitted except for the multi-quantum-well structure active layer 46. It is needless to say that various changes, modifications and alternatives described in the first embodiment are applicable also to this embodiment and that similar effects are obtained therefrom.

In this embodiment, the multi-quantum-well structure active layer 46 consists of four $In_{0.2}Ga_{0.8}N$ quantum well layers 54 and three $In_{0.05}Ga_{0.95}N$ barrier layers 55, which are alternately stacked. The thickness of each barrier layer 55 is 4 nm or less.

For the four $In_{0.2}Ga_{0.8}N$ quantum well layers 54 and three $In_{0.05}Ga_{0.95}N$ barrier layers 55, which constitute the multi-quantum-well structure active layer 46, their compositions may be set according to a necessary laser oscillation wavelength. The In content of the quantum well layers 54 should be increased for longer oscillation wavelengths and decreased for shorter oscillation wavelengths. Further, the quantum well layers 54 and the barrier layers 55 may also be made of a quaternary or higher mixed crystal semiconductor composed of InGaN ternary mixed crystal and, in addition to this, other elements such as Al in trace amounts. Alternatively, the barrier layers 55 may be made of GaN simply. Further, the number of the quantum well layers 54 may be either two or three, instead of four. However, the layer thickness of each barrier layer 55 should be set to 4 nm or less, regardless of material and number of the quantum well layers so that there occur overlaps of the wave functions of electrons and holes between the quantum well layers.

Next, with reference to FIGS. 10 and 11, the method for fabricating the above gallium nitride semiconductor laser is described. Although the MOCVD (Metal Organic Chemical Vapor Deposition) method is used in the following description, yet the growth method has only to be capable of making GaN epitaxially grown, and other vapor phase growth method such as MBE (Molecular Beam Epitaxy) or HDVPE (Hydride Vapor Phase Epitaxy) may be also used.

First, on a sapphire substrate 1 having the c plane as a top surface and placed within a growth furnace, a GaN buffer layer 2 is grown to 35 nm at a growth temperature of 550° C. by using trimethyl gallium (TMG) and ammonia ($NH_3$) as source materials.

Next, with the growth temperature elevated to 1050° C., a 3 $\mu$m thick Si-doped n-GaN contact layer 3 is grown by using TMG and $NH_3$ as well as silane gas ($SiH_4$) as source materials. Subsequently, with trimethyl aluminum (TMA) added to the source materials and with the growth temperature held at 1050° C., a Si-doped $n-Al_{0.1}Ga_{0.9}N$ cladding layer 4 is grown to a thickness of 0.7 $\mu$m. Subsequently, with TMA withdrawn from the source materials and with the growth temperature held at 1050° C., a Si-doped n-GaN guide layer 5 is grown to 0.05 $\mu$m.

Next, with the growth temperature lowered to 750° C., by using TMG, $NH_3$ and trimethyl indium (TMI) as source materials, alternate growth of an $In_{0.2}Ga_{0.8}N$ quantum well layer (with a thickness of 3 nm) 54 and an $In_{0.05}Ga_{0.95}N$ barrier layer (with a thickness of 2 nm) 55 is repeated three times and finally one more $In_{0.2}Ga_{0.8}N$ quantum well layer (with a thickness of 3 nm) 54 is grown, whereby a multi-quantum-well structure active layer (with a total thickness of 18 nm) 46 is completed. Subsequently, with TMG, TMA and $NH_3$ used as source materials and with the growth temperature held at 750° C., a $Al_{0.2}G_{0.8}N$ evaporation inhibiting layer 7 is grown to a thickness of 10 nm.

Next, with the growth temperature elevated again to 1050° C. and with TMG and $NH_3$ as well as cyclopentadienyl magnesium ($Cp_2Mg$) used as source materials, a Mg-doped p-GaN guide layer 8 is grown to a thickness of 0.05 $\mu$m. Subsequently, with TMA added to the source materials and with the growth temperature held at 1050° C., a 0.7 $\mu$m thick Mg-doped $p-Al_{0.1}Ga_{0.9}N$ cladding layer 9 is grown. Then, with TMA withdrawn from the source material and with the growth temperature held at 1050° C., a Mg-doped p-GaN contact layer 10 is grown to 0.2 $\mu$m in thickness. Thus, a gallium nitride epitaxial wafer is completed.

After these process steps, this wafer is annealed in a nitrogen gas atmosphere of 800° C., so that the Mg-doped p-type layers are lowered in resistance.

Further, by using ordinary photolithography and dry etching techniques, an etching is done from the topmost surface of the p-GaN contact layer 10 until the n-GaN contact layer 3 is exposed, to obtain a 200 μm wide stripe shape. Next, by using photolithography and dry etching techniques similar to the foregoing, the p-GaN contact layer 10 and the p-Al$_{0.1}$Ga$_{0.9}$N cladding layer 9 are etched so that the remaining p-GaN contact layer 10 has a ridge structure in a 5 μm wide stripe shape.

Subsequently, a 200 nm thick SiO$_2$ insulating film 13 is formed on the side faces of the ridge R and the surface of the p-type layer other than the ridge R. A p-side electrode 11 composed of nickel and gold is formed on the surface of this SiO$_2$ insulating film 13 and the p-GaN contact layer 10, and an n-side electrode 12 composed of titanium and aluminum is formed on the surface of the n-GaN contact layer 3 exposed by the etching. Thus, a gallium nitride LD (laser diode) wafer is completed.

After these process steps, the thus obtained wafer is cleaved in a direction vertical to the ridge stripe to thereby form a laser resonator end face, and then the wafer is divided into individual chips. Then, each chip is mounted on a stem, and the electrodes are connected with lead terminals by wire bonding. As a result, a gallium nitride semiconductor LD device is completed.

With respect to the blue LD device fabricated in this way, it was verified that laser characteristics of an oscillation wavelength of 430 nm and an oscillation threshold current of 40 mA can be obtained, and that an optical output power can be modulated by injection of a high-frequency current of from 300 MHz to maximally around 1 GHz. Consequently, with the blue LD device of this embodiment, a blue LD device capable of preventing data read errors and usable for optical disks was realized.

Figure 12:
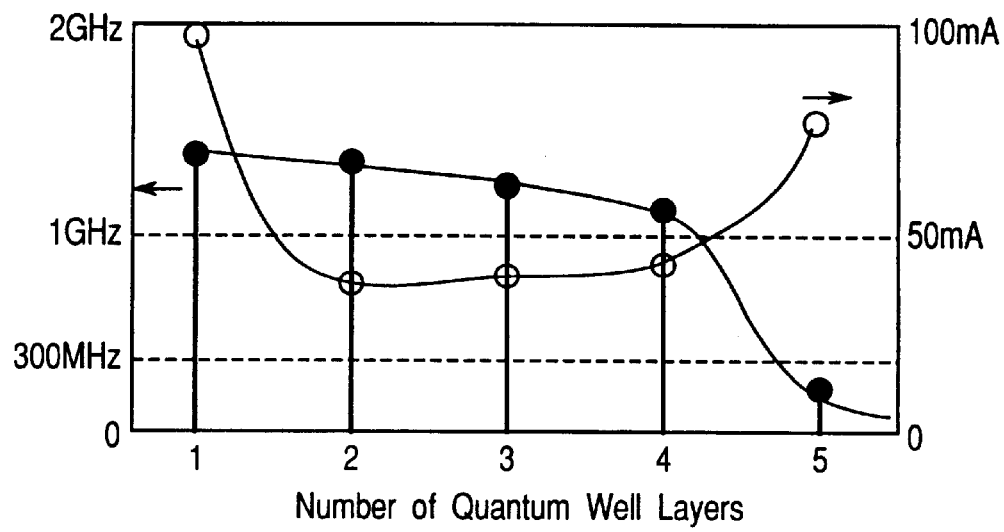
FIG. 12 is a graph showing the dependence of threshold current on the number of quantum well layers as well as the dependence of a maximum modulation frequency of injection current capable of modulating the optical output power on the number of quantum well layers in the fifth embodiment.

FIG. 12 is a graph representing variations in threshold current value and maximum modulation frequency of injection current capable of modulating an optical output power resulting when the number of quantum well layers is changed from 1 to 5 in gallium nitride semiconductor laser devices. The semiconductor lasers are same in structure as the gallium nitride semiconductor laser device according to the fifth embodiment of the present invention, except for the number of quantum well layers and the number of barrier layers, which depends on the number of quantum well layers. As can be understood from this figure, it is only the gallium nitride semiconductor laser devices according to the present invention, in which the number of quantum well layers is two to four, that have a low oscillation threshold current and have an optical output power enough modulated by the injection of a high-frequency current in the range of from 300 MHz to around 1 GHz.

Figure 13:
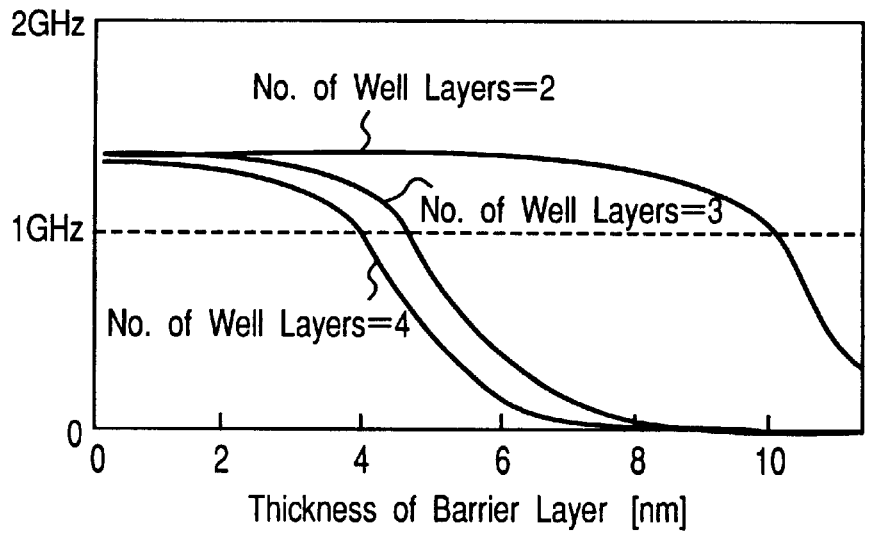
FIG. 13 is a graph showing the dependence of a maximum frequency of injection current capable of modulating the optical output power on the thickness of the barrier layer in gallium nitride semiconductor laser devices having two, three and four quantum well layers, respectively.

The quantum well layers 54 and the barrier layers 55, which constitute the multi-quantum-well structure active layer 6, have both been set to a layer thickness of 3 nm and 2 nm, respectively, in this embodiment. However, as far as the layer thickness of each of the quantum well layers 54 and the layer thickness of each of the barrier layers 55 are set to 10 nm or less and 4 nm or less, respectively, for uniform injection of electrons and holes into each of the quantum well layers, similar effects can be obtained even with other layer thicknesses. FIG. 13 is a graph representing variations in injection current maximum modulation frequency capable of modulating an optical output power when the layer thickness of the barrier layer is changed in gallium nitride semiconductor laser devices in which the number of quantum well layers is two, three, and four, respectively. These semiconductor lasers are similar in structure to the gallium nitride semiconductor laser device according to the fifth embodiment, except that they differ in the layer thickness of the barrier layers. It can be understood from this figure that if the layer thickness of the barrier layers is set to 4 nm or less, then the optical output power can be enough modulated by the injection of a high-frequency current in the range of from 300 MHz to around 1 GHz. It has also been verified that if the layer thickness of each quantum well layer is set to 10 nm or less, then the optical output power can be sufficiently modulated by the injection of a high-frequency current of even around 1 GHz.

Sixth Embodiment

Figure 14:
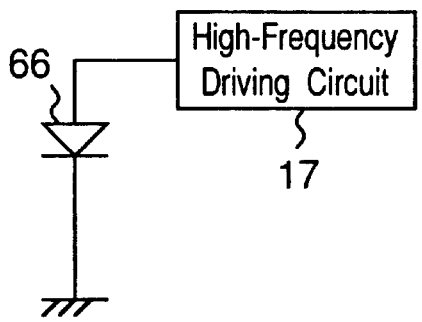
FIG. 14 is a circuit diagram showing a semiconductor laser device and a driving circuit according to a sixth embodiment of the present invention.

FIG. 14 is a circuit diagram showing a semiconductor laser device with a driving circuit according to a sixth embodiment of the present invention. A semiconductor laser device 66 shown in FIG. 14 is a gallium nitride semiconductor laser device, which has four quantum well layers, obtained by the fifth embodiment of the present invention. A high-frequency driving circuit 17 has a construction similar to the driving circuit used in the second embodiment, and is intended to modulate an injection current to the semiconductor laser device 66 at a high frequency and to thereby modulate its optical output power. In this embodiment, the modulation frequency of the injection current was set to 300 MHz. The gallium nitride semiconductor laser device according to the fifth embodiment has revealed that its optical output power is modulatable even by a maximum injection current modulation frequency of higher than 1 GHz, and the optical output power was enough modulated by a frequency of 300 MHz. When this embodiment was used as a light source for an optical disk, by virtue of sufficiently modulated optical. output power of the semiconductor laser, the laser light coherence was able to be lowered so that noise due to return light from the disk surface was able to be reduced. As a result, it became possible to read data from the optical disk without errors.

The modulation frequency of the injection current was set to 300 MHz in this embodiment. However, other modulation frequencies in a range of from 300 MHz to a maximum frequency of around 1 GHz may be used to drive the nitride semiconductor laser so long as the modulation frequency allows the noise due to return light of laser light from the disk surface to be reduced by lowering the coherence of the laser light.

Seventh Embodiment

Figure 15:
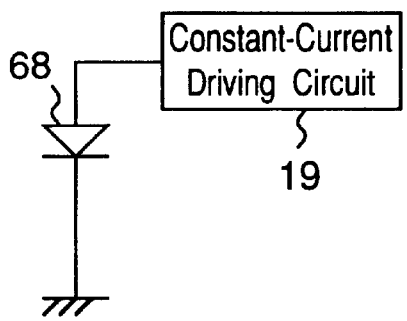
FIG. 15 is a circuit diagram showing a semiconductor laser device and a driving circuit according to a seventh embodiment of the present invention.

FIG. 15 is a circuit diagram showing a semiconductor laser device with a driving circuit according to a seventh embodiment of the present invention. For a semiconductor laser device 68 shown in FIG. 15, the gallium nitride semiconductor laser device with four quantum well layers obtained by the fifth embodiment of the present invention is used, but is adjusted in the stripe width for formation of the ridge structure as well as in the depth of etching of the p-Al$_{0.1}$Ga$_{0.9}$N cladding layer 9 so that the semiconductor laser device 68 is a self-oscillating semiconductor laser in which the optical output power is modulated even by the injection of an unmodulated constant current. In this example, the stripe width was set to 3 μm, and the film thickness of the p-Al$_{0.1}$Ga$_{0.9}$N cladding layer 9 left in the etching process was set to 0.2 μm. The stripe width and the film thickness are not limited to the values of this example, and have only to fall within a range of 1 μm to 5 μm and a range of 0.05 μm to 0.5 μm, respectively. The optical output power modulation frequency for the self-oscillating gallium nitride semiconductor laser device fabricated in this way was 800 MHz.

By virtue of the arrangement that two to four quantum well layers are provided and that the thickness of the barrier layers is 4 nm or less, the gallium nitride semiconductor laser device according to the present invention is susceptible to modulation of the densities of electrons and holes present within the quantum well layers. Thus, it is easy to fabricate a self-oscillating semiconductor laser in which an optical output power is modulated not only by modulating the densities of electrons and holes with modulation of the injection current but also by modulating the densities of electrons and holes even with the injection of an unmodulated constant current, thus making it possible to modulate the optical output power at higher frequencies.

A constant current driving circuit 19, which is similar to the driving circuit used in the third embodiment, is intended to inject a constant current to the semiconductor laser. When this embodiment was used as a light source for an optical disk, by virtue of sufficiently modulated optical output power of the semiconductor laser, the laser light coherence was able to be lowered so that noise due to return light from the disk surface was able to be reduced. As a result, it became possible to read data from the optical disk without errors.

The gallium nitride semiconductor laser device 18 used in the seventh embodiment is a self-oscillating semiconductor laser obtained by adjusting both the stripe width for forming the ridge structure and the depth to which the p-$Al_{0.1}Ga_{0.9}N$ cladding layer 9 is etched. Alternatively, the self-oscillating semiconductor laser may be obtained by providing a saturable absorption layer (not shown) near the active layer, as done in ordinary-GaAs semiconductor lasers or the like.

Eighth Embodiment

Figure 17:
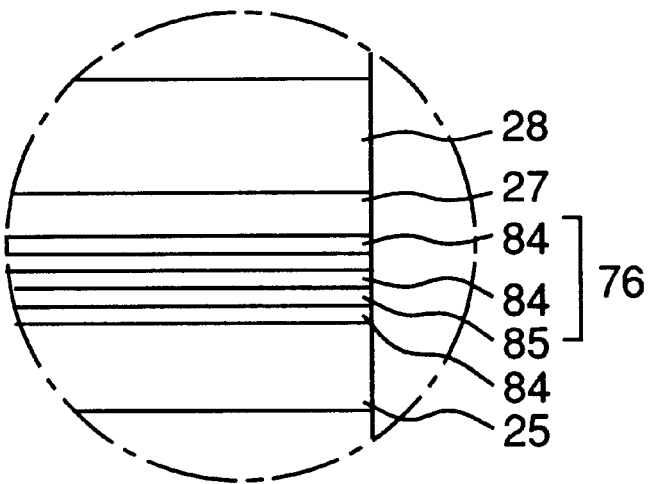
FIG. 17 is an enlarged sectional view showing part D in FIG. 16.

FIG. 16 is a sectional view showing a gallium nitride semiconductor LED device according to an eighth embodiment of the present invention, and FIG. 17 is an enlarged sectional view of part D of FIG. 16. This gallium nitride semiconductor LED device is same as the gallium nitride semiconductor LED device according to the fourth embodiment, except for the structure of multi-quantum-well structure active layer 76. Therefore, for this gallium nitride semiconductor laser device, the same reference numerals as used in FIGS. 7 and 8 are used and detailed description of the layers is omitted except for the multi-quantum-well structure active layer 76. It is needless to say that various changes, modifications and alternatives described in connection with the fourth embodiment are applicable also to this embodiment and that similar effects are obtained therefrom.

In this embodiment, the multi-quantum-well structure active layer 76 consists of three $In_{0.2}Ga_{0.8}N$ quantum well layers 84 and two $In_{0.05}Ga_{0.95}N$ barrier layers 85, which are alternately stacked. The thickness of each barrier layer 85 is 4 nm or less.

For the three $In_{0.2}Ga_{0.8}N$ quantum well layers 84 and the two $In_{0.05}Ga_{0.95}N$ barrier layers 85, which constitute the multi-quantum-well structure active layer 76, their compositions may be set according to a necessary light emission wavelength. The In content of the quantum well layers 84 should be increased for longer emission wavelengths and decreased for shorter emission wavelengths. Further, the quantum well layers 84 and the barrier layers 85 may also be made of a quaternary or higher mixed crystal semiconductor composed of a ternary mixed crystal of InGaN and, in addition to this, other elements such as Al in trace amounts. Alternatively, the barrier layers 85 may be made of GaN simply. Further, the number of the quantum well layers 84 may be either two or four, instead of three. However, the layer thickness of each barrier layer 85 should be set to 4 nm or less, regardless of material and number of the quantum well layers so that there occur overlaps of the wave functions of electrons and holes between the quantum well layers.

Next, with reference to FIGS. 16 and 17, the method of fabricating the above gallium nitride semiconductor LED is described. Although the MOCVD (Metal Organic Chemical Vapor Deposition) method is used in the following description, yet the growth method has only to be capable of making GaN epitaxially grown, and other vapor phase growth method such as MBE (Molecular Beam Epitaxy) or HDVPE (Hydride Vapor Phase Epitaxy) may be also used.

First, on a sapphire substrate 21 having the c-plane as a top surface and placed within a growth furnace, a GaN buffer layer 22 is grown to 35 nm at a growth temperature of 550° C. by using TMG and $NH_3$ as source materials.

Next, with the growth temperature elevated to 1050° C., a 3 μm thick Si-doped n-GaN contact layer 23 is grown by using TMG and $NH_3$ as well as $SiH_4$ as source materials. Subsequently, with TMA added to the source materials and with the growth temperature held at 1050° C., a Si-doped n-$Al_{0.1}Ga_{0.9}N$ cladding layer 24 is grown to a thickness of 0.3 μm. Subsequently, with TMA withdrawn from the source materials and with the growth temperature held at 1050° C., a Si-doped n-GaN guide layer 25 is grown to 0.05 μm.

Next, with the growth temperature lowered to 750° C., by using TMG, $NH_3$ and TMI as source materials, alternate growth of an $In_{0.2}Ga_{0.8}N$ quantum well layer (with a thickness of 3 nm) 84 and an $In_{0.05}Ga_{0.95}N$ barrier layer (with a thickness of 4 nm) 85 is repeated twice and then one more $In_{0.2}Ga_{0.8}N$ quantum well layer (with a thickness of 3 nm) 84 is grown, whereby a multi-quantum-well structure active layer (with a total thickness of 17 nm) 76 is completed. Subsequently, with TMG, TMA and $NH_3$ used as source materials and with the growth temperature held at 750° C., an $Al_{0.2}Ga_{0.8}N$ evaporation inhibiting layer 27 is grown to a thickness of 10 nm.

Next, with the growth temperature elevated again to 1050° C. and with TMG and $NH_3$ as well as $Cp_2Mg$ (cyclopentadienyl magnesium) used as source materials, a Mg-doped p-GaN guide layer 28 is grown to a thickness of 0.05 μm. Subsequently, with TMA added to the source materials and with the growth temperature held at 1050° C., a 0.3 μm thick Mg-doped p-$Al_{0.1}Ga_{0.9}N$ cladding layer 29 is grown. Then, with TMA withdrawn from the source material and with the growth temperature held at 1050° C., a Mg-doped p-GaN contact layer 30 is grown to 0.2 μm in thickness. Thus, a gallium nitride epitaxial wafer is completed.

After these process steps, this wafer is annealed in a nitrogen gas atmosphere of 800° C., so that the Mg-doped p-type layers are lowered in resistance.

Further, by using ordinary photolithography and dry etching techniques, an etching is done at predetermined regions from the topmost surface of the p-GaN contact layer 30 until the n-GaN contact layer 23 is exposed, for the fabrication of the LED device.

Subsequently, a p-side electrode 31 composed of nickel and gold is formed on the surface of the p-GaN contact layer 30, and an n-side electrode 32 composed of titanium and aluminum is formed on the surface of the n-GaN contact layer 23 exposed by the etching. Thus, a gallium nitride LED wafer is completed.

After these process steps, the thus obtained wafer is divided into individual chips. Then, each chip is mounted on a stem, and the electrodes are connected with lead terminals by wire bonding. As a result, a gallium nitride semiconductor LED device is completed.

Figure 18:
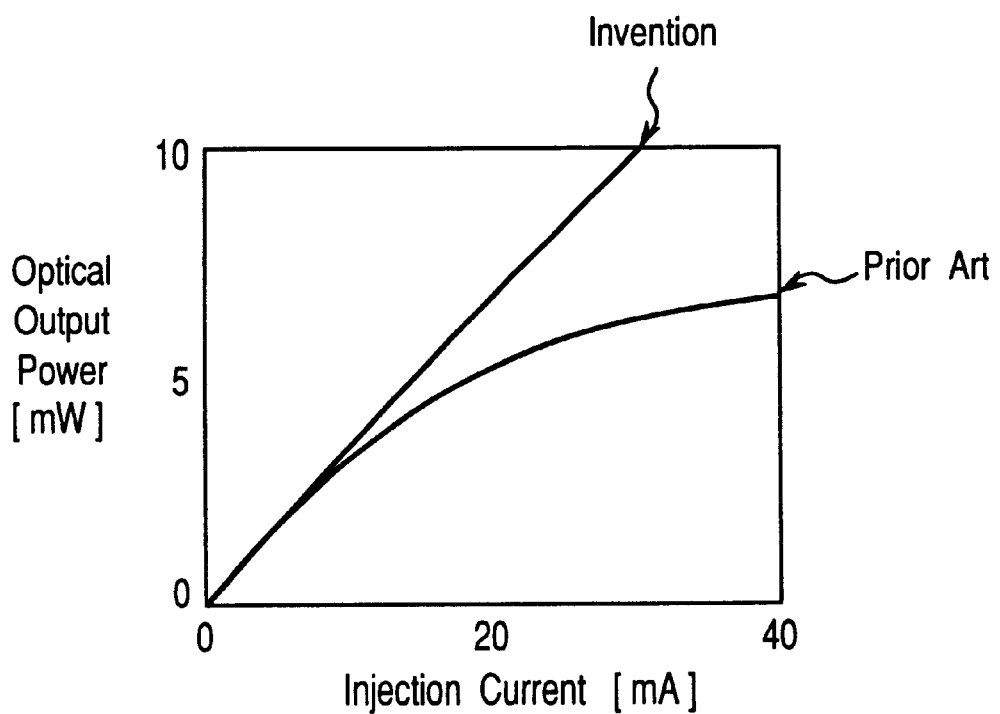
FIG. 18 is a graph showing current vs. optical output power characteristics of the semiconductor light emitting diode device according to the eighth embodiment and the semiconductor light emitting diode device according to the prior art, respectively.
Figure 19:
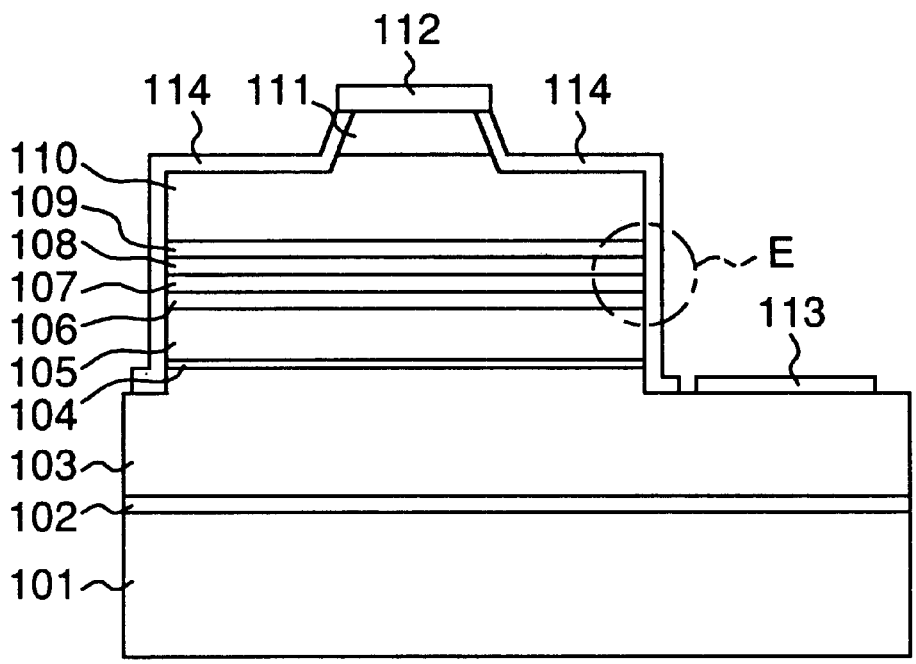
FIG. 19 is a sectional view showing a structure example of a blue LD according to the prior art.
Figure 20:
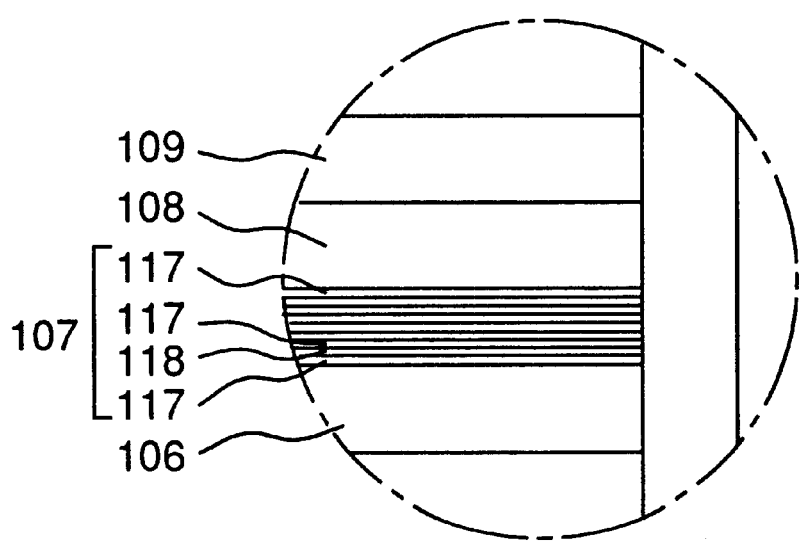
FIG. 20 is an enlarged sectional view showing part E in FIG. 19.
Figure 21:
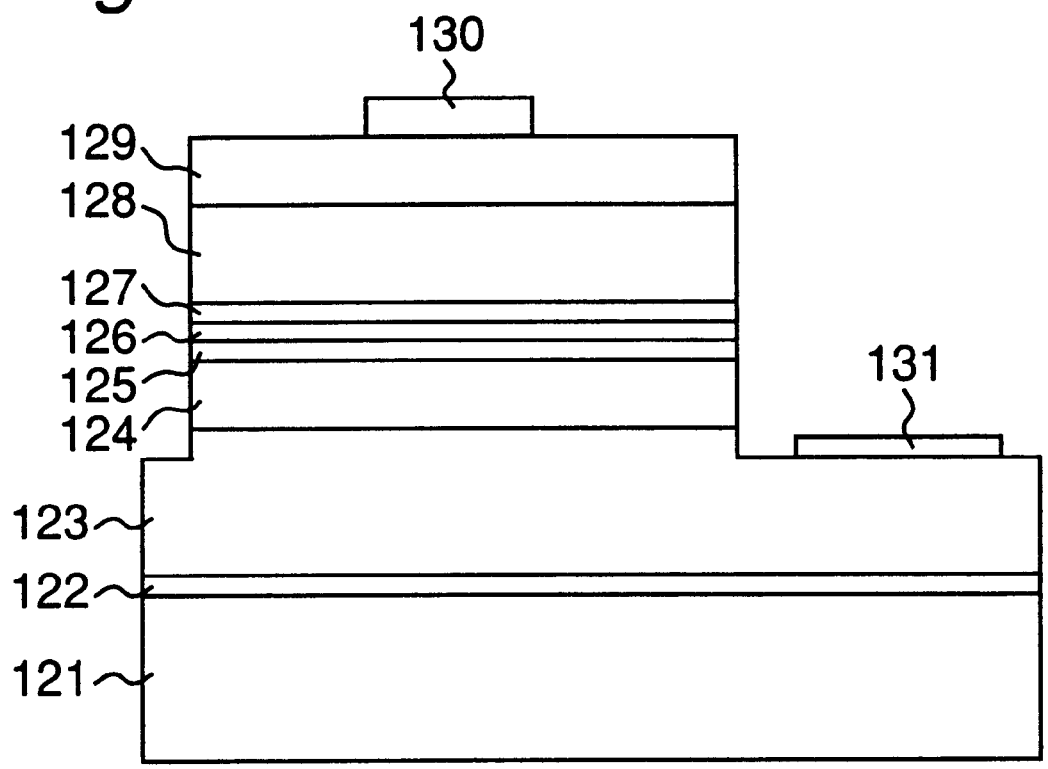
FIG. 21 is a sectional view showing a structure example of a blue LED according to the prior art.

The blue LED device fabricated in this way had light emitting-characteristics of a peak emission wavelength of 430 nm and an output power of 6 mW for a forward current of 20 mA. Also, as obvious from FIG. 18, the output power was not saturated even at a large injection current, which proves that the current—optical output power characteristic was improved, as compared with the conventional LED device. In addition, the wavelength shift due to the current injection, which is 7 nm with the conventional blue LED device, was reduced to 2 um according to the present invention.

The quantum well layers 84 and the barrier layers 85, which constitute the multi-quantum-well structure active layer 76, have a layer thickness of 3 nm and a layer thickness of 4 nm, respectively, in this embodiment. However, as far as the quantum well layers 84 and the barrier layers 85 have thicknesses of 10 nm or less and 4 nm or less, respectively, for the uniform injection of electrons and holes into each of the quantum well layers, similar effects can be obtained even with other layer thicknesses.

INDUSTRIAL APPLICABILITY

The gallium nitride semiconductor light emitting device of the present invention is used as a semiconductor laser device for processing information in optical disks or the like, and a semiconductor light emitting diode device for large-size color display devices or the like. The gallium nitride semiconductor light emitting device, when combined with a driving circuit for injecting an electric current into a semiconductor laser device, is usable also as a semiconductor laser light source device for, for example, data reading from an optical disk.

What is claimed is:

1. A gallium nitride semiconductor light emitting device having emission wavelengths within a band corresponding to ultraviolet to green, comprising a semiconductor substrate, an active layer having a quantum well structure and made of nitride semiconductor containing at least indium and gallium, and a first cladding layer and a second cladding layer for sandwiching the active layer therebetween, wherein
   the active layer consists of two quantum well layers and one barrier layer interposed between the quantum well layers, each quantum well layer has a layer thickness of approximately 10 nm or less and the barrier layer has a layer thickness of approximately 10 nm or less.

2. The gallium nitride semiconductor light emitting device according to claim 1, wherein each of the quantum well layers has electrons and holes uniformly distributed.

3. The gallium nitride semiconductor light emitting device according to claim 1, wherein the gallium nitride semiconductor light emitting device is a semiconductor laser device and the active layer forms an oscillating section of the semiconductor laser device.

4. The gallium nitride semiconductor light emitting device according to claim 1, wherein said nitride semiconductor forming said active layer consists essentially of nitrogen, indium, and gallium.

5. The gallium nitride semiconductor light emitting device according to claim 3, wherein the semiconductor laser device is a self-oscillating semiconductor laser device.

6. The gallium nitride semiconductor light emitting device according to claim 3, further comprising a driving circuit for injecting an electric current into the semiconductor laser device.

7. The gallium nitride semiconductor light emitting device according to claim 3, wherein said light emitting device generates a modulated optical output when an electric current is injected into said light emitting device.

8. The gallium nitride semiconductor light emitting device according to claim 6, wherein the electric current is a modulated current and a modulation frequency of the current is 300 MHz or more.

9. A gallium nitride semiconductor light emitting device having emission wavelengths within a band corresponding to ultraviolet to green, comprising a semiconductor substrate, an active layer having a quantum well structure and made of nitride semiconductor containing at least indium and gallium, and a first cladding layer and a second cladding layer for sandwiching the active layer therebetween, wherein
   the active layer forms an oscillating section of the semiconductor laser device, and consists of two quantum well layers and one barrier layer interposed between the quantum well layers, each quantum well layer having a layer thickness of approximately 10 nm or less and the barrier layer having a layer thickness of approximately 10 nm or less and wherein one of the first and second cladding layers is a p-type cladding layer, and the p-type cladding layer has a ridge portion and a planar portion on opposite sides of the ridge portion.

10. The gallium nitride semiconductor laser device according to claim 9, wherein the ridge has a width of about 1 $\mu$m to 5 $\mu$m.

11. The gallium nitride semiconductor laser device according to claim 9, wherein said planar portion has a film thickness of 0.05 $\mu$m to 0.5 $\mu$m.

* * * * *